United States Patent [19]

Filler

[11] 4,410,822
[45] Oct. 18, 1983

[54] ACCELERATION-RESISTANT CRYSTAL RESONATOR

[75] Inventor: Raymond L. Filler, Freehold, N.J.

[73] Assignee: The United States of America as represented by the Secretary of the Army, Washington, D.C.

[21] Appl. No.: 389,315

[22] Filed: Jun. 17, 1982

[51] Int. Cl.³ .............................................. H01L 41/08
[52] U.S. Cl. .................................... 310/311; 310/346; 310/360; 310/361; 310/348; 29/25.35
[58] Field of Search .............. 310/360, 361, 342, 346, 310/311, 331, 332, 315, 339, 348, 329; 331/158, 162, 166, 175, 116 R, 56; 29/25.35

[56] References Cited

U.S. PATENT DOCUMENTS 2,410,825  11/1946  Lane ................................ 310/361 X
4,219,754   8/1980  Hoshi et al. ..................... 310/342 X
4,317,059   2/1982  Besson ............................. 310/361
4,344,010   8/1982  Vig et al. ......................... 310/361
4,365,182  12/1982  Ballato et al. .................. 310/361

OTHER PUBLICATIONS

"Improvement in System Performance Using Crystal Oscillator for Acceleration Sensitivity", by Joseph M. Przyjemski, Proceedings of the 32nd Annual Symposium on Frequency Control.

Primary Examiner—Mark O. Budd
Attorney, Agent, or Firm—Robert P. Gibson; Jeremiah G. Murray; Edward Goldberg

[57] ABSTRACT

A crystal resonator features two crystals mounted such that the acceleration sensitivity vector of one crystal is in an antiparallel relationship to the acceleration sensitivity vector of the other crystal. The composite resonator eliminates acceleration-induced frequency shifts for acceleration in all directions.

10 Claims, 3 Drawing Figures

ACCELERATION-RESISTANT CRYSTAL RESONATOR

STATEMENT OF GOVERNMENT INTEREST

The invention described herein may be manufactured, used and licensed by or for the Government for Governmental purposes without the payment of any royalties thereon or therefor.

BACKGROUND OF THE INVENTION

The present invention relates generally to improvements in the acceleration resistance of quartz crystal resonators, and more particularly pertains to the elimination of acceleration-induced frequency shifts in such resonators.

Quartz crystals are commonly used to control the frequency of electrical oscillators and in other circuits where an electrical resonant frequency is required. A major problem with such crystals is that their natural resonant frequency changes when acceleration forces are applied to the crystal. The deleterious effects of these frequency shifts are well-known to designers of systems that require high-precision frequency control.

There are two classes of methods for reducing the acceleration sensitivity of a crystal: active and passive. In active methods, an acceleration sensor and a feedback network is used to alter the oscillator frequency and thereby compensate for the acceleration-induced frequency shifts. In passive methods, no attempt is made to sense the vibration or to dynamically change the output frequency.

One passive method of minimizing the acceleration-induced frequency shifts is disclosed in U.S. patent application Ser. No. 196,508, now U.S. Pat. No. 4,365,182. In that application, it is shown that acceleration resistant resonators can be produced from a single quartz plate that is optically twinned into a left-handed quartz portion and a right-handed quartz portion wherein the effective thickness of the two portions is equal. After depositing a pair of electrodes on each portion of the plate, the thickness of the electrode pairs is adjusted so that the resonant frequency of one portion is substantially the same as the resonant frequency of the other portion. The antiparallel alignment of the crystallographic axes accounts for the reduced sensitivity to acceleration.

Another approach to the problem is disclosed in U.S. patent application Ser. No. 086,504, now U.S. Pat. No. 4,344,010. That application shows that acceleration sensitivity can be minimized by the use of two separate resonators, one left-handed and one right-handed, that are aligned such that all three crystallographic axes are antiparallel.

Although these earlier methods minimize the acceleration-induced frequency shifts, none of the methods completely cancels the effects of acceleration forces due to the fact that all of the approaches consist of aligning only the crystallographic axes to eliminate the effects of vibration.

SUMMARY OF THE INVENTION

The general purpose of this invention is to provide an improved crystal resonator having a decreased sensitivity to acceleration forces.

It has recently been determined that the acceleration sensitivity of a quartz crystal resonator has vector properties. (See "Improvement In System Performance Using Crystal Oscillator Compensated For Acceleration Sensitivity," Przyjemski; Proc. of the 32nd Annual Symposium on Frequency Control) Experimental work has shown that this acceleration sensitivity vector is not oriented relative to the crystallographic axes in any consistent manner from crystal to crystal in similarly designed resonators.

In this invention, the magnitude and direction of the acceleration sensitivity vectors of two crystals are determined and a composite resonator is constructed by aligning the two vectors in an antiparallel relationship. When the acceleration sensitivity vectors of the two crystals are of equal magnitude, a more complete cancellation of vibrational effects is achieved for all acceleration directions.

DETAILED DESCRIPTION OF THE INVENTION

Figure 1:
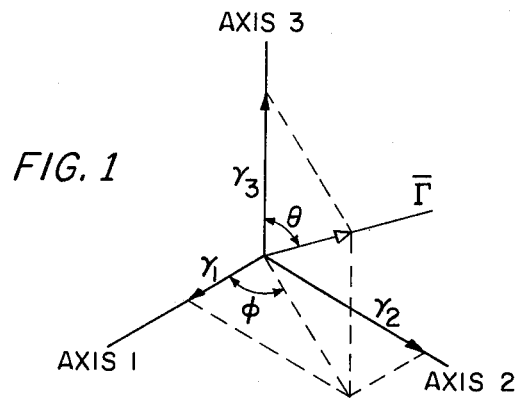
FIG. 1 shows an orthogonal coordinate system for determining the magnitude and direction of the acceleration sensitivity vector.

It is commonly known that the fractional frequency shift of the output frequency of a crystal oscillator is proportional to the change in acceleration magnitude that the oscillator experiences. The proportionality constant is a function of the direction of the acceleration as referenced to a given set of axes fixed to the oscillator. Referring to FIG. 1, the direction of greatest acceleration sensitivity is shown as vector $\overline{\Gamma}$ along with a set of reference axes.

For any given direction of acceleration, the frequency shift is given as $$\frac{F_1 - F_o}{F_o} = \frac{\Delta F}{F_o} = \gamma(\theta,\phi) \, |\overline{A}(\theta,\phi)| \quad (1)$$

where $F_1$ is the frequency when the resonator is experiencing an acceleration of magnitude $|\overline{A}|$, $F_0$ is the static frequency and $\gamma(\theta,\phi)$ is the direction dependent coefficient of acceleration sensitivity.

The value of $\gamma(\theta,\phi)$ is determined by using the "2G-Tipover" test, a test that is well known to those skilled in the art. Using this test, a crystal is rotated about a horizontal axis in the earth's gravitational field and the frequency is recorded at various angular positions relative to the initial position. The measured values of $\gamma(\theta,\phi)$ exhibit a sinusoidal dependence and, therefore, it can be deduced that the acceleration sensitivity is a vector with magnitude and direction. Thus, for the acceleration vector denoted by $\overline{\Gamma}$, $$\frac{\Delta F}{F_o} = \overline{\Gamma} \cdot \overline{A} \quad (2)$$

The magnitude and direction of $\overline{\Gamma}$ can be determined by measuring the scalar components along each of three mutually perpendicular axes as shown in FIG. 1. The magnitude is given by $$|\overline{\Gamma}| = \sqrt{\gamma_1^2 + \gamma_2^2 + \gamma_3^2}$$

and the direction is given by $$\hat{\Gamma} = \frac{\gamma_1}{|\overline{\Gamma}|} \hat{i} + \frac{\gamma_2}{|\overline{\Gamma}|} \hat{j} + \frac{\gamma_3}{|\overline{\Gamma}|} \hat{k}$$

where $\hat{i}$, $\hat{j}$ and $\hat{k}$ are unit vectors along the axes.

Figure 2:
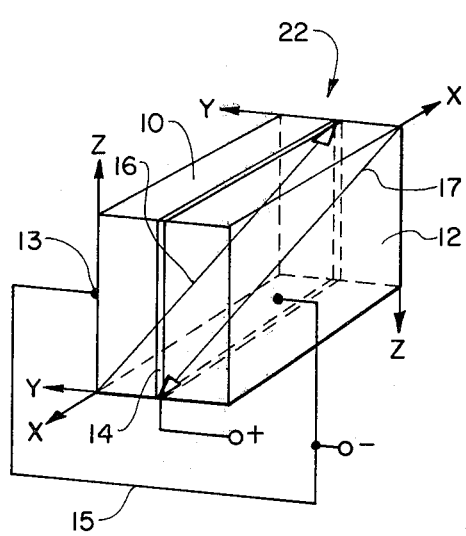
FIG. 2 shows a pair of crystals connected in parallel with the acceleration sensitivity vectors in antiparallel relationship.

Referring now to FIG. 2, a composite crystal resonator 22 is made up of two crystals, 10 and 12. These are connected in parallel which requires the interconnecting lead 15 and a common center electrode 14. The axes shown in FIG. 2 are not necessarily the crystallographic axes but are presented solely for reference purposes in order to emphasize the position of the acceleration sensitivity vectors 16 and 17 of crystals 10 and 12 respectively. Also, while the figure shows the crystals mechanically joined, this is not necessary in the actual construction of the device. In accordance with the present invention, the acceleration sensitivity vector 16 of crystal is positioned in antiparallel relationship with the acceleration sensitivity vector 17 of crystal 12. Thus, when the magnitude of the two vectors is equal, the resonator is completely acceleration and shock compensated.

Figure 3:
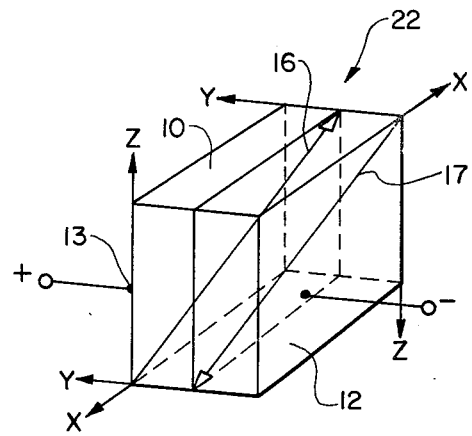
FIG. 3 shows a pair of crystals connected in series with the acceleration sensitivity vectors in antiparallel relationship.

FIG. 3 shows another embodiment where again crystal 10 has its acceleration sensitivity vector 16 in an antiparallel relationship with the acceleration sensitivity vector 17 of crystal 12. There is no central electrode needed in this embodiment since one of the crystals is epitaxially joined to the other. The result is that the two crystals 10 and 12 are electrically coupled in series with respect to each other.

The method which has been described is of particular advantage in high shock and vibration environments where accelerations occur in arbitrary directions.

It should be understood, of course, that the foregoing disclosure relates to only a preferred embodiment of the invention and that numerous modifications or alterations may be made therein without departing from the spirit and the scope of the invention as set forth in the appended claims.

What is claimed is:

1. A composite resonant crystal structure comprising:
   first and second resonant crystals, each having an acceleration sensitivity vector of substantially equal magnitude corresponding to the magnitude and direction of maximum frequency shift per change in acceleration;
   said crystals being positioned in a fixed relationship such that the acceleration sensitivity vector of said first crystal is disposed in an antiparallel relationship with the acceleration sensitivity vector of said second crystal whereby the effect of acceleration in all directions on the resonant frequency of the composite structure is minimized; and,
   said first and second crystal being electrically coupled to each other.

2. A composite resonant crystal structure as claimed in claim 1, wherein said crystals are mechanically coupled.

3. A composite resonant crystal structure as claimed in claim 1, wherein said crystals are electrically coupled in series.

4. A composite resonant crystal structure as claimed in claim 1, wherein said crystals are electrically coupled in parallel.

5. A resonant crystal structure comprising:
   first and second resonant crystals, each having an acceleration sensitivity vector of substantially equal magnitude;
   said acceleration sensitivity vector for each of said crystals being oriented such that acceleration in a plane normal to said vector results in a substantially null change in the resonant frequency of said crystal;
   said first and second crystals being positioned in a fixed relationship such that the acceleration sensitivity vector of said first crystal is disposed in an antiparallel relationship with the acceleration sensitivity vector of said second crystal; and
   said first and second crystals being electrically coupled.

6. A resonant crystal structure as set forth in claim 5 wherein said crystals are mechanically coupled.

7. A resonant crystal structure as set forth in claim 5 wherein said crystals are electrically coupled in series.

8. A resonant crystal structure as set forth in claim 5 wherein said crystals are electrically coupled in parallel.

9. A method of improving the acceleration resistance of a composite crystal resonator comprising the steps of:
   (a) determining the magnitude and direction of an acceleration sensitivity vector representing the maximum change in frequency per change in acceleration for a first resonant crystal;
   (b) repeating step (a) for a second resonant crystal;
   (c) positioning two such resonant crystals having acceleration sensitivity vectors of substantially equal magnitude in a fixed relationship such that the acceleration sensitivity vectors are antiparallel with respect to each other; and
   (d) coupling said first and second crystals.

10. The method of claim 9 wherein said acceleration sensitivity vector is determined by the steps of:
   (1) defining three mutually perpendicular axes, 1, 2 and 3 with respect to a resonant crystal;
   (2) measuring the change in resonant frequency of said crystal for rotation about each of said axes;
   (3) determining the maximum change in frequency, $\gamma$ for each of said axes;
   (4) determining the magnitude of the acceleration sensitivity vector, $|\overline{\Gamma}|$, as $$|\overline{\Gamma}| = \sqrt{\gamma_1^2 + \gamma_2^2 + \gamma_3^2}$$

where $\gamma_1$, $\gamma_2$, and $\gamma_3$ are the scalar components of maximum frequency change along axes 1, 2 and 3 respectively, and the direction of the vector, as $$\hat{\Gamma} = \frac{\gamma_1}{|\overline{\Gamma}|} \hat{i} + \frac{\gamma_2}{|\overline{\Gamma}|} \hat{j} + \frac{\gamma_3}{|\overline{\Gamma}|} \hat{k}$$

where $\hat{i}$, $\hat{j}$ and $\hat{k}$ are unit vectors along the axes 1, 2 and 3, respectively.

* * * * *